(12) United States Patent
Fan

(10) Patent No.: US 11,316,069 B2
(45) Date of Patent: Apr. 26, 2022

(54) MICRO-LED CHIP AND MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yong Fan, Shenzhen (CN)

(*) Notice: Subject to any disclaimer, the term of this patent is extended or adjusted under 35 U.S.C. 154(b) by 389 days.

(21) Appl. No.: 16/626,530

(22) PCT Filed: Dec. 18, 2019

(86) PCT No.: PCT/CN2019/126142
§ 371 (c)(1),
(2) Date: Dec. 25, 2019

(87) PCT Pub. No.: WO2020/238169
PCT Pub. Date: Dec. 3, 2020

(65) Prior Publication Data
US 2021/0336078 A1 Oct. 28, 2021

(30) Foreign Application Priority Data
May 31, 2019 (CN) .......................... 201910466611.8

(51) Int. Cl.
*H01L 33/08* (2010.01)
*H01L 33/00* (2010.01)
(Continued)

(52) U.S. Cl.
CPC ............ *H01L 33/08* (2013.01); *H01L 25/167* (2013.01); *H01L 33/007* (2013.01); *H01L 33/0093* (2020.05); *H01L 33/382* (2013.01); *H01L 33/405* (2013.01); *H01L 33/06* (2013.01); *H01L 33/32* (2013.01); *H01L 2933/0016* (2013.01)

(58) Field of Classification Search
CPC ....... H01L 25/167; H01L 33/62; H01L 33/08; H01L 33/007; H01L 33/38; H01L 33/382; H01L 33/0093; H01L 33/405; H01L 2933/0016; H01L 25/0753; H01L 33/06;
(Continued)

(56) References Cited

U.S. PATENT DOCUMENTS

2006/0169993 A1 8/2006 Fan
2007/0090488 A1 4/2007 Teng et al.
(Continued)

FOREIGN PATENT DOCUMENTS

CN 101026204 A 8/2007
CN 101072464 A 11/2007
(Continued)

*Primary Examiner* — Savitri Mulpuri

(57) ABSTRACT

The present invention provides a micro-LED chip, a manufacturing method of the micro-LED chip, and a display panel. The micro-LED chip includes a plurality of sub-chips connected in series. The first sub-chip and the last sub-chip are connected to a first electrode and a second electrode, respectively. Accordingly, a voltage across the micro-LED chip is increased, power consumption of a driving thin film transistor (TFT) is reduced, and a high power consumption problem of driving TFTs in conventional micro-LED displays is improved.

13 Claims, 3 Drawing Sheets

(51) Int. Cl.
*H01L 33/38* (2010.01)
*H01L 33/40* (2010.01)
*H01L 25/16* (2006.01)
*H01L 33/06* (2010.01)
*H01L 33/32* (2010.01)

(58) Field of Classification Search
CPC .. H01L 2933/0066; H01L 33/14; H01L 33/32
See application file for complete search history.

(56) References Cited

U.S. PATENT DOCUMENTS

| | | |
|---|---|---|
| 2008/0083929 A1 | 4/2008 | Fan et al. |
| 2013/0341658 A1* | 12/2013 | Lee .......................... H01L 33/24 977/762 |
| 2019/0148601 A1* | 5/2019 | Park ........................ H01L 33/14 257/88 |
| 2020/0066938 A1* | 2/2020 | Seong ...................... H01L 33/50 |
| 2020/0176642 A1* | 6/2020 | Hung ..................... H01L 33/382 |

FOREIGN PATENT DOCUMENTS

| | | |
|---|---|---|
| CN | 101118920 A | 2/2008 |
| CN | 108365061 A | 8/2018 |
| CN | 109742197 A | 5/2019 |
| CN | 110224049 A | 9/2019 |

* cited by examiner

MICRO-LED CHIP AND MANUFACTURING METHOD THEREOF, AND DISPLAY PANEL This application claims priority to Chinese patent application no. 201910466611.8, entitled "Micro-LED Chip and Manufacturing Method thereof, and Display Panel", filed on May 31, 2019, and the entire contents of which are incorporated by reference in this application.

1. FIELD OF DISCLOSURE

The present invention relates to a field of display technology and in particular, to a micro-LED chip and a manufacturing method thereof, and a display panel.

2. DESCRIPTION OF RELATED ART

Micro-LEDs have become the focus of next-generation display technology due to their higher brightness, better luminous efficiency, and lower power consumption.

However, since a driving thin film transistor (TFT) mainly works in a saturation region during display, a voltage across a source electrode and a drain electrode of the TFT is large, but the voltage across the micro-LED is low, which increases power consumption and leads to low drive efficiency.

Therefore, there is a need to provide a solution to solve a high power consumption problem in conventional micro-LED displays.

SUMMARY

The present invention provides a micro-LED chip and a manufacturing method thereof to solve high power consumption problem of driving TFTs in conventional micro-LED displays.

In order to solve the above problem, the present invention provides a solution as follows.

The present invention provides a micro light-emitting diode (micro-LED) chip, comprising:

a buffer layer, a first semiconductor layer, an active layer, a second semiconductor layer, an insulating layer, a current diffusion layer, a protective layer, and a first electrode and a second electrode which are stacked on each other;

wherein the insulating layer divides the first semiconductor layer, the active layer, and the second semiconductor layer into at least two sub-chips separated from each other, the second semiconductor layer of each sub-chip is connected to the first semiconductor layer of the next sub-chip via the current diffusion layer, the first electrode is electrically connected to the first semiconductor layer of the first sub-chip, and the second electrode is electrically connected to the second semiconductor layer of the last sub-chip.

In the micro-LED chip of the present invention, the current diffusion layer covers the second semiconductor layer of the previous sub-chip and is connected to the first semiconductor layer of the next sub-chip through a via hole defined in the insulating layer.

In the micro-LED chip, the current diffusion layer is in contact with a portion of the second semiconductor layer of the previous sub-chip and connected to the first semiconductor layer of the next sub-chip through a via hole defined in the insulating layer.

In the micro-LED chip, the first electrode is electrically connected to the first semiconductor layer of the first sub-chip via the current diffusion layer.

In the micro-LED chip, the first electrode is electrically and directly connected to the first semiconductor layer of the first sub-chip.

In the micro-LED chip, the second electrode is electrically connected to the second semiconductor layer of the last sub-chip via the current diffusion layer.

In the micro-LED chip, the second electrode is electrically and directly connected to the second semiconductor layer of the last sub-chip.

In the micro-LED chip, the first semiconductor layer is an N-type gallium nitride layer, the active layer is a gallium nitride multiple quantum well layer, the second semiconductor layer is a P-type gallium nitride layer, the first electrode is an N-type electrode, and the second electrode is a P-type electrode.

In the micro-LED chip, the current diffusion layer is made of tin oxide or graphene.

In the micro-LED chip, the buffer layer is an intrinsic gallium nitride layer.

The present invention provides a manufacturing method of a micro light-emitting diode (micro-LED) chip, comprising following steps:

providing a base substrate and sequentially forming a buffer layer, an N-type gallium nitride layer, a gallium nitride multiple quantum well layer, and a P-type gallium nitride layer on the base substrate;

etching a predetermined region of the P-type gallium nitride layer and the gallium nitride multiple quantum well layer to form a first via hole and expose the N-type gallium nitride layer;

etching a predetermined region of the exposed N-type gallium nitride layer to form a second via hole and expose the buffer layer;

forming an insulating layer on the P-type gallium nitride layer, the N-type gallium nitride layer, and the buffer layer;

etching away the insulating layer on the N-type gallium nitride layer and a portion of the P-type gallium nitride layer;

forming a current diffusion layer on the P-type gallium nitride layer, the N-type gallium nitride layer, and the insulating layer;

etching away the current diffusion layer on the insulating layer on a first side of the first via hole to expose the insulating layer, wherein the first side is one side adjacent to the last sub-chip;

forming a protective layer on the current diffusion layer and the insulating layer;

etching away the protective layer on the current diffusion layer of the last sub-chip, etching away the protective layer in the first via hole and the second via hole of the first sub-chip on one side of the first sub-chip away from the last sub-chip, and exposing the current diffusion layer;

forming a P-type electrode on the current diffusion layer of the last sub-chip, and forming an N-type electrode in the first via hole and the second via hole of the first sub-chip on one side of the first sub-chip away from the last sub-chip;

bonding the base substrate to be a temporary substrate; and stripping off the base substrate.

The present invention further provides a micro light-emitting diode (micro-LED) display panel, comprising a micro-LED chip, the micro-LED chip comprising:

a buffer layer, a first semiconductor layer, an active layer, a second semiconductor layer, an insulating layer, a current diffusion layer, a protective layer, and a first electrode and a second electrode which are stacked on each other;

wherein the insulating layer divides the first semiconductor layer, the active layer, and the second semiconductor layer into at least two sub-chips separated from each other, the second semiconductor layer of each sub-chip is connected to the first semiconductor layer of the next sub-chip via the current diffusion layer, the first electrode is electrically connected to the first semiconductor layer of the first sub-chip, and the second electrode is electrically connected to the second semiconductor layer of the last sub-chip.

In the micro-LED display panel of the present invention, the current diffusion layer covers the second semiconductor layer of the previous sub-chip and is connected to the first semiconductor layer of the next sub-chip through a via hole defined in the insulating layer.

In the micro-LED display panel of the present invention, the current diffusion layer is in contact with a portion of the second semiconductor of the previous sub-chip and connected to the first semiconductor layer of the next sub-chip through a via hole defined in the insulating layer.

In the micro-LED display panel of the present invention, the first electrode is electrically connected to the first semiconductor layer of the first sub-chip via the current diffusion layer.

In the micro-LED display panel of the present invention, the first electrode is electrically and directly connected to the first semiconductor layer of the first sub-chip.

In the micro-LED display panel of the present invention, the second electrode is electrically connected to the second semiconductor layer of the last sub-chip via the current diffusion layer.

In the micro-LED display panel of the present invention, the second electrode is electrically and directly connected to the second semiconductor layer of the last sub-chip.

In the micro-LED display panel of the present invention, the first semiconductor layer is an N-type gallium nitride layer, the active layer is a gallium nitride multiple quantum well layer, the second semiconductor layer is a P-type gallium nitride layer, the first electrode is an N-type electrode, and the second electrode is a P-type electrode.

In the micro-LED display panel of the present invention, the current diffusion layer is made of tin oxide or graphene.

The present invention provides a micro-LED chip and a manufacturing method thereof, wherein the micro-LED chip comprises a buffer layer, a first semiconductor layer, an active layer, a second semiconductor layer, an insulating layer, a current diffusion layer, a protective layer, and a first electrode and a second electrode which are stacked on each other. The insulating layer divides the first semiconductor layer, the active layer, and the second semiconductor layer into at least two sub-chips separated from each other, the second semiconductor layer in each sub-chip is connected to the first semiconductor layer in the next sub-chip via the current diffusion layer, the first electrode is electrically connected to the first semiconductor layer of the first sub-chip, and the second electrode is electrically connected to the second semiconductor layer of the last sub-chip. The sub-chips are separated by the insulating layer, and the sub-chips are connected in series by the current diffusion layer, thereby increasing a voltage across the micro-LED, reducing power consumption of a driving thin film transistor (TFT), and improving a high power consumption problem of driving TFTs of conventional micro-LED displays.

BRIEF DESCRIPTION OF DRAWINGS

The present invention will become apparent with reference to the following detailed description and accompanying drawings, in which.

DETAILED DESCRIPTION OF EMBODIMENTS

Figure 1:
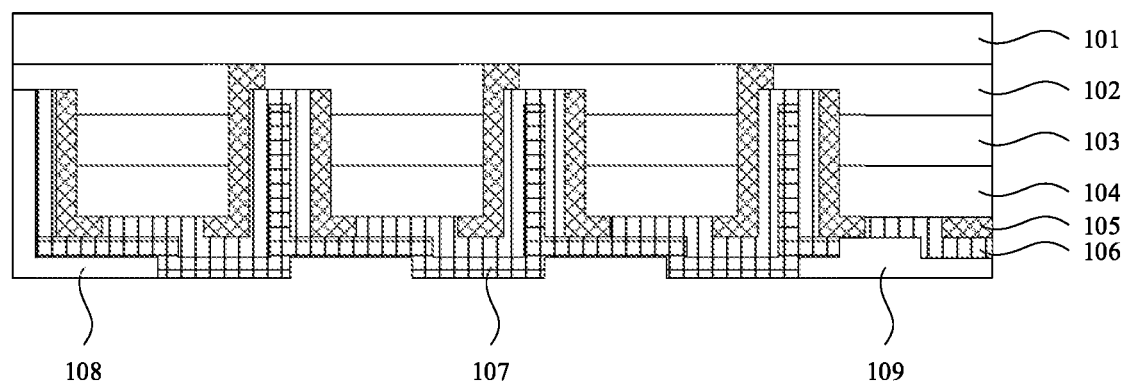
FIG. 1 is a schematic structural view illustrating a micro-LED chip according to one embodiment of the present invention.

Embodiments of the present invention are described in detail below with reference to the accompanying drawings. The directional terms in the present disclosure, such as "upper", "lower", "front", "rear", "left", "right", "inside", "outside", and "lateral", are merely illustrative with reference to the accompanying drawings, and are not intended to limit the protection scope of the present application. In the drawings, the same reference numerals in the drawings denote the same elements.

In view of a high power consumption problem of driving thin film transistors (TFTs) in conventional micro-LED displays, the present invention provides a micro-LED chip to solve this problem.

In one embodiment, as shown FIG. 1, the present application provides a micro LED chip comprises the following sequentially stacked on each other from top to bottom:

A buffer layer 101: In an embodiment, the buffer layer 101 is an intrinsic gallium nitride layer with a thick thickness greater than 2 um; however, this embodiment is only an example and is not intended to limit the present invention.

A first semiconductor layer 102, the active layer 103, and the second semiconductor layer 104: In one embodiment, the first semiconductor layer 102 is an N-type gallium nitride layer, and the active layer 103 is a gallium nitride multiple quantum well layer, and the second semiconductor layer 104 is a P-type gallium nitride layer. The P-type gallium nitride layer can be a magnesium (Mg)-doped gallium nitride layer, the N-type gallium nitride layer can be a silicon (Si)-doped gallium nitride layer, and the gallium nitride quantum well layer can be an indium gallium nitride/gallium nitride (InGaN/GaN) layer that is sequentially stacked multiple times. The present embodiment is only an example and is not intended to limit the present invention. In alternative embodiments, materials of the first semiconductor layer 102, the active layer 103, and the second semiconductor layer 104 can vary according to actual requirements of the micro-LED chip.

An insulating layer 105 used to divide the first semiconductor layer 102, the active layer 103, and the second semiconductor layer 104 into at least two independent sub-chips, wherein in one embodiment, the insulating layer 105 is made of one or more of silicon oxide, silicon nitride, silicon oxynitride, aluminum nitride, glass coating, and polyimide, wherein the insulating layer 105 is preferably made of silicon oxide with good light transmission properties.

A current diffusion layer 106: The current diffusion layer 106 is used to connect the second semiconductor layer 104 in each sub-chip with the first semiconductor layer 102 in the next sub-chip to form an ohmic contact, so that holes generated in the P-type semiconductor layer and/or electrons generated in the N-type semiconductor layer can effectively move into the active layer, thereby increasing luminous efficiency of a micro-LED display panel. At the same time, the current diffusion layer 106 also plays a role of reflecting light. In one embodiment, the current diffusion layer 106 is made of graphene, indium tin oxide, zinc oxide, nickel, silver, aluminum, gold, platinum, palladium, magnesium, tungsten, and other suitable materials with good electrical conductivity and reflectivity. The current diffusion layer 106 can be a single-layer structure or a multilayer structure.

A protective layer 107: The protective layer 107 is used to cover and isolate the current diffusion layer 106, and also isolate water/oxygen and conduct heat, slow down performance degradation of each film layer in the micro-LED chip 10, and thereby prolong a service life of the micro-LED chip. In one embodiment, material of the protective layer 107 is any one of silicon oxide, silicon nitride, silicon oxynitride, and aluminum nitride, wherein the protective layer 107 is preferably made of silicon nitride, silicon oxynitride, and aluminum nitride which have good thermal conductivity.

A first electrode 108 and the second electrode 109: The first electrode 108 is electrically connected to the first semiconductor layer 102 of the first sub-chip, and the second electrode 109 is electrically connected to the second semiconductor layer 104 of the last sub-chip. In one embodiment, the first electrode 108 is an N-type electrode, and the second electrode 109 is a P-type electrode. The first electrode 108 and the second electrode 109 are made of one or more of metals or alloys such as indium, tin, zinc, nickel, silver, aluminum, gold, platinum, palladium, magnesium, tungsten, and alloys thereof, and the first electrode 108 and the second electrode 109 can be a single-layer metal structure or a multilayer metal structure.

In each sub-chip, the N-type semiconductor layer 102, the active layer 103, and the P-type semiconductor layer 104 constitute a light-emitting p-n junction. When the light-emitting p-n junction is connected to an external circuit, and a voltage is applied to the light-emitting p-n junction through the external circuit, electrons and holes are generated in the N-type semiconductor layer 102 and the P-type semiconductor layer 104, respectively. The generated electrons and holes move into the active layer 103 and combine to emit photons in the active layer 103, thereby realizing electroluminescence of the micro-LED chip.

The N-type semiconductor layer 102 of the first sub-chip is electrically connected to the N-type electrode 108, the P-type semiconductor layer 104 of the first sub-chip and the N-type semiconductor layer of the second sub-chip are electrically connected through the current diffusion layer 106, and the P-type semiconductor layer 104 of the second sub-chip and the N-type semiconductor layer of the third sub-chip are electrically connected through the current diffusion layer 106. Sequentially backwards, the P-type semiconductor layer 104 of the last sub-chip is electrically connected to the P-type electrode 109, and thereby the sub-chips are connected in series. When the micro-LED chip is connected to the external circuit through the N-type electrode and the P-type electrode, and an external voltage is applied to the micro-LED chip of the present embodiment, each of the sub-chips will obtain a working voltage and simultaneously emits light due to the electroluminescence phenomenon. Accordingly, the entire micro-LED chip obtains a working voltage which is multiple times the working voltage of a single sub-chip, thereby increasing a voltage drop across the entire micro-LED chip.

The present invention provides a micro-LED chip. The micro-LED chip is separated into several independent sub-chips by an insulating layer, and a second semiconductor layer in a previous sub-chip is connected to a first semiconductor layer in a next sub-chip, so that the sub-chips are connected in series, a voltage across the micro-LED chip is increased, power consumption of a driving thin film transistor (TFT) is reduced, and a high power consumption problem of driving TFTs in conventional micro-LED displays is improved.

The embodiment of FIG. 1 only shows a film/layer structure of the micro-LED chip of the present invention, but is not intended to limit the film/layer structure of the micro-LED chip of the present application. In alternative embodiments, the film/layer structure of the micro-LED chip can vary according to requirements.

According to one embodiment of the present invention, the current diffusion layer 106 is connected to the second semiconductor layer 104 of the previous sub-chip by covering a mesa of the second semiconductor layer 104 of the previous sub-chip, and then is connected to the first semiconductor layer 102 of the next sub-chip through the via hole in the insulating layer 105.

In another embodiment, as shown in FIG. 1, the current diffusion layer 106 is connected to the second semiconductor layer 104 of the previous sub-chip by contacting a portion of the mesa of the second semiconductor layer 104 of the previous sub-chip, and then is connected to the first semiconductor layer 102 of the next sub-chip through the via hole in the insulating layer 105.

According to one embodiment, the first electrode 108 is electrically connected to the first semiconductor layer 102 of the first sub-chip through the current diffusion layer 106. In other words, there still has the current diffusion layer 106 on a mesa on which the first electrode 108 is in contact with the first semiconductor layer 102 of the first sub-chip.

In another embodiment, as shown in FIG. 1, the first electrode 108 is directly electrically connected to the first semiconductor layer 102 of the first sub-chip.

According to one embodiment of the present invention, as shown in FIG. 1, the second electrode 109 is electrically connected to the second semiconductor layer 104 of the last sub-chip through the current diffusion layer 106.

According to another embodiment of the present invention, the second electrode 109 is directly electrically connected to the second semiconductor layer 104 of the last sub-chip. In other words, the current diffusion layer 106 is not disposed at a position where the second electrode 109 is in contact with the second semiconductor layer 104 of the last sub-chip.

Figure 2:
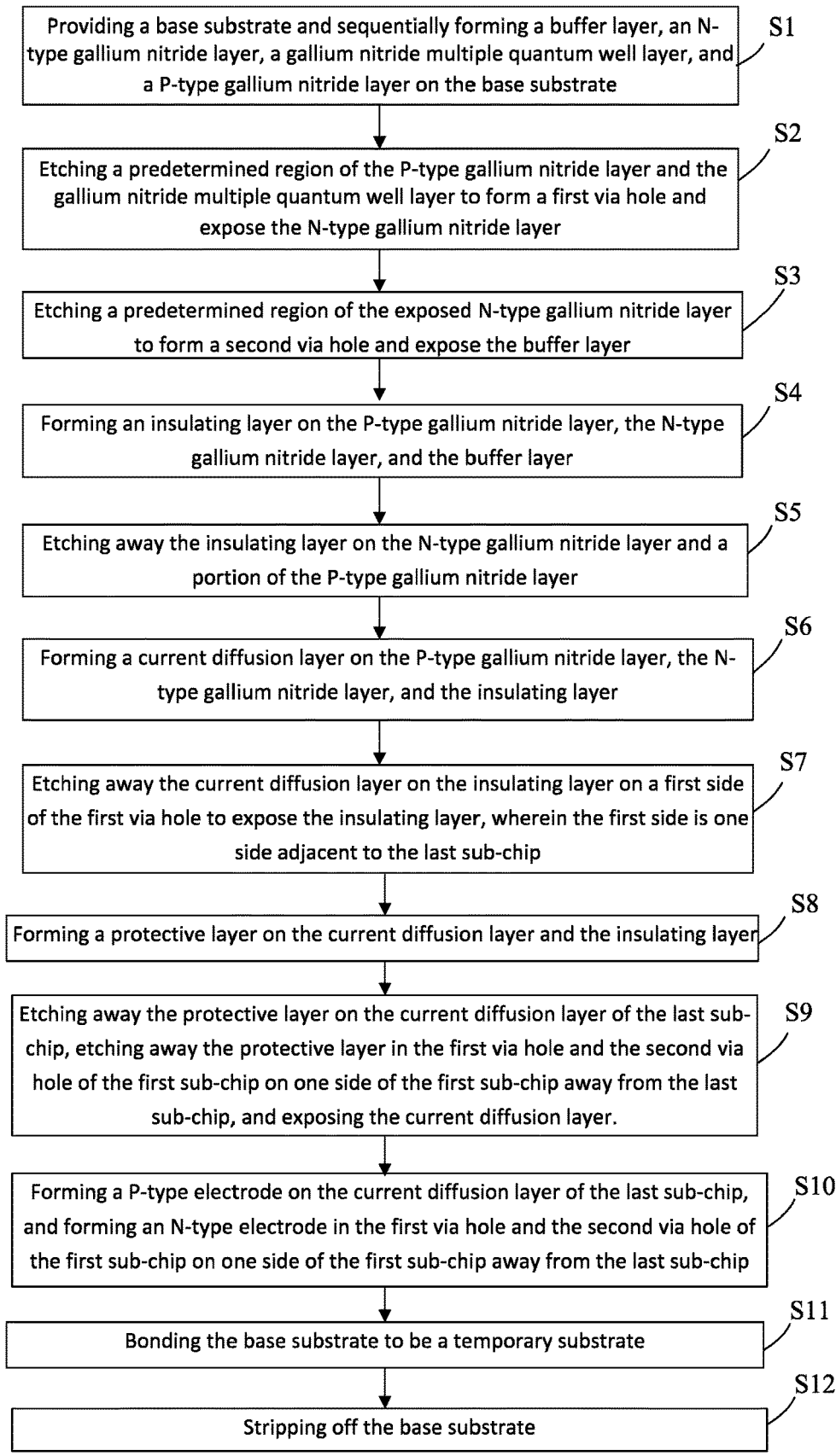
FIG. 2 is a process flow diagram illustrating a manufacturing method of the micro-LED chip according to one embodiment of the present invention.

As shown in FIG. 2, the present invention provides a manufacturing method of a micro light-emitting diode (micro-LED) chip, comprising following steps:

Step S1: providing a base substrate and sequentially forming a buffer layer, an N-type gallium nitride layer, a gallium nitride multiple quantum well layer, and a P-type gallium nitride layer on the base substrate.

According to one embodiment of the present invention, the base substrate is a sapphire base substrate. The sapphire base substrate has advantages of mature manufacturing technology, good stability, high mechanical strength, easy processing and cleaning, and reusability. The base substrate may also be a silicon carbide (SiC) substrate, a silicon (Si) substrate, or other suitable substrates; and the present invention is not limited in this regard.

According to one embodiment of the present invention, a buffer layer, an N-type gallium nitride layer, a gallium nitride multiple quantum well layer, and a p-type gallium nitride layer are sequentially grown on the cleaned substrate through a metalorganic chemical vapor deposition (MOCVD) epitaxial technique. The buffer layer is a thicker gallium nitride layer with a thickness greater than 2 um.

After the growth of the P-type gallium nitride layer, a chip needs to be acid-washed with nitric acid hydrochloride (aqua regia) for 30 minutes, and cleaned to remove metal contaminants on a surface of the chip. Then, the chip is washed with concentrated sulfuric acid at room temperatures for 5 minutes to remove organic pollution on its surface. After that, the wafer surface was deoxidized with hydrogen fluoride, and finally rinsed with deionized water and dried.

Step S2: etching a predetermined region of the P-type gallium nitride layer and the gallium nitride multiple quantum well layer to form a first via hole and expose the N-type gallium nitride layer.

According to a predetermined number of the sub-chips of the micro-LED chip and a size of each sub-chip, a predetermined region for etching is determined. Using photoresist as a mask, inductively coupled plasma (ICP) dry etching is performed to remove the P-type gallium nitride layer and the gallium nitride multiple quantum well layer in the predetermined region, so that a first via hole is defined in an etched area, and the N-type gallium nitride layer is exposed through the first via hole.

In this step, the predetermined region of the exposed N-type gallium nitride layer can also be etched by using other methods; and the methods are not limited to ICP dry etching.

Step S3: etching a predetermined region of the exposed N-type gallium nitride layer to form a second via hole and expose the buffer layer.

Using photoresist as a mask, ICP dry etching is performed to etch a predetermined region of the N-type gallium nitride layer in the first via hole, and the N-type gallium nitride layer in the predetermined region is removed to expose the buffer layer thereunder. The second via hole is formed in an etched area, and the N-type gallium nitride layer in the first via hole forms a mesa of the n-type gallium nitride layer. An area of the mesa is as small as possible while requirements for forming an ohmic contact of the n-type gallium nitride layer are satisfied.

In this step, the predetermined region of the exposed N-type gallium nitride layer can be etched by using other methods, such as wet etching; the methods are not limited to ICP dry etching.

Step S4: forming an insulating layer on the P-type gallium nitride layer, the N-type gallium nitride layer, and the buffer layer.

The chip is covered with the insulating layer by using technology such as plasma enhanced chemical vapor deposition (PECVD). The insulating layer covers the P-type gallium nitride layer, and covers the N-type gallium nitride layer and the buffer layer through the via hole. The insulating layer 105 is made of one or more of silicon oxide, silicon nitride, silicon oxynitride, aluminum nitride, glass coating, and polyimide, wherein silicon oxide with good light transmission properties is preferred.

Step S5: etching away the insulating layer on the N-type gallium nitride layer and a portion of the P-type gallium nitride layer;

By etching, the insulating layer on the N-type gallium nitride layer is removed to expose a mesa of the N-type gallium nitride layer, and a portion of the insulating layer on the P-type gallium nitride layer is removed to expose a portion of the insulating layer on the P-type gallium nitride layer.

Step S6: forming a current diffusion layer on the P-type gallium nitride layer, the N-type gallium nitride layer, and the insulating layer.

By magnetron sputtering or thermal evaporation, the current diffusion layer is deposited on the chip to cover the exposed P-type semiconductor layer, N-type semiconductor layer, and the insulation layer. The current diffusion layer 106 is made of graphene, indium tin oxide, zinc oxide, nickel, silver, aluminum, gold, platinum, palladium, magnesium, tungsten and other suitable materials with good electrical conductivity and reflectivity. The current diffusion layer 106 can be a single-layer structure or a multilayer structure.

Step S7: etching away the current diffusion layer on the insulating layer on a first side of the first via hole to expose the insulating layer, wherein the first side is one side adjacent to the last sub-chip.

The current diffusion layer on the insulating layer on the first side of the first via hole is removed, so that the P-type semiconductor layer and the N-type semiconductor layer in the same sub-chip form an open circuit.

Step S8: forming a protective layer on the current diffusion layer and the insulating layer.

An additional layer of insulating material covering the chip is used as the protective layer. Specifically, the additional layer is made of any one of silicon oxide, silicon nitride, silicon nitride oxide, and aluminum nitride, wherein materials having good thermal conductivity, such as silicon nitride, silicon oxynitride, and aluminum nitride, are preferred.

Step S9: etching away the protective layer on the current diffusion layer of the last sub-chip, etching away the protective layer in the first via hole and the second via hole of the first sub-chip on one side of the first sub-chip away from the last sub-chip, and exposing the current diffusion layer.

By etching, the protective layer on the current diffusion layer of the last sub-chip is removed, and the protective layer in the first via hole and the second via hole of the first sub-chip on one side of the first sub-chip away from the last sub-chip is removed, so that the N-type semiconductor layer of the first sub-chip or the current diffusion layer connected to the N-type semiconductor layer is exposed, and the P-type semiconductor layer of the last sub-chip or the current diffusion layer connected to the P-type semiconductor layer is exposed for fabrication of electrodes.

Step S10: forming a P-type electrode on the current diffusion layer of the last sub-chip, and forming an N-type electrode in the first via hole and the second via hole of the first sub-chip on one side of the first sub-chip away from the last sub-chip.

An N-type electrode is formed on the exposed N-type semiconductor layer of the first sub-chip, or on the exposed current diffusion layer connected to the N-type semiconductor layer. The N-type electrode forms an ohmic contact with the N-type semiconductor layer of the first sub-chip. A P-type electrode is formed on the P-type semiconductor layer of the last sub-chip, or on a current diffusion layer connected to the P-type semiconductor layer. The P-type electrode forms an ohmic contact with the P-type semiconductor layer of the last sub-chip. The N-type electrode and the P-type electrode are made of one or more of metals or alloys such as indium, tin, zinc, nickel, silver, aluminum, gold, platinum, palladium, magnesium, and tungsten.

Step S11: bonding the base substrate to be a temporary substrate.

Step S12: stripping off the base substrate.

The present invention provides a manufacturing method of a micro-LED chip. The Micro-LED chip is divided into several independent sub-chips by an etching technique, and the sub-chips are separated by an insulating layer. The second semiconductor layer in the previous sub-chip is connected to the first semiconductor layer in the next sub-chip through a current diffusion layer. Accordingly, the sub-chips are connected in series, a voltage across the micro-LED chip is increased, power consumption of a driving TFT is reduced, and a high power consumption problem of driving TFTs of conventional micro-LED displays is improved.

The present invention further provides a micro light-emitting diode (micro-LED) display panel, comprising a micro-LED chip, the micro-LED chip comprising stacked on each other sequentially from bottom to top:

a buffer layer, a first semiconductor layer, an active layer, a second semiconductor layer, an insulating layer, a current diffusion layer, a protective layer, and a first electrode and a second electrode;

wherein the insulating layer divides the first semiconductor layer, the active layer, and the second semiconductor layer into at least two sub-chips separated from each other, the second semiconductor layer of each sub-chip is connected to the first semiconductor layer of the next sub-chip via the current diffusion layer, the first electrode is electrically connected to the first semiconductor layer of the first sub-chip, and the second electrode is electrically connected to the second semiconductor layer of the last sub-chip.

The present invention provides a micro-LED display panel. The micro-LED display panel comprises a micro-LED chip. The Micro-LED chip is divided into several independent sub-chips by an insulating layer. The second semiconductor layer in the previous sub-chip is connected to the first semiconductor layer in the next sub-chip via a current diffusion layer. Accordingly, the sub-chips are connected in series, thereby increasing a voltage across the micro-LED chip, reducing power consumption of a driving TFT, and improving a high power consumption problem of driving TFTs of conventional micro-LED displays.

According to one embodiment of the present invention, the current diffusion layer covers the second semiconductor layer of the previous sub-chip and is connected to the first semiconductor layer of the next sub-chip through a via hole defined in the insulating layer.

According to one embodiment of the present invention, the current diffusion layer is in contact with a portion of the second semiconductor of the previous sub-chip and connected to the first semiconductor layer of the next sub-chip through a via hole defined in the insulating layer.

According to one embodiment of the present invention, the first electrode is electrically connected to the first semiconductor layer of the first sub-chip via the current diffusion layer.

According to one embodiment of the present invention, the first electrode is electrically and directly connected to the first semiconductor layer of the first sub-chip.

According to one embodiment of the present invention, the second electrode is electrically connected to the second semiconductor layer of the last sub-chip via the current diffusion layer.

According to one embodiment of the present invention, the second electrode is electrically and directly connected to the second semiconductor layer of the last sub-chip.

According to one embodiment of the present invention, the first semiconductor layer is an N-type gallium nitride layer, the active layer is a gallium nitride multiple quantum well layer, the second semiconductor layer is a P-type gallium nitride layer, the first electrode is an N-type electrode, and the second electrode is a P-type electrode.

According to one embodiment of the present invention, the current diffusion layer is made of tin oxide or graphene.

Figure 3:
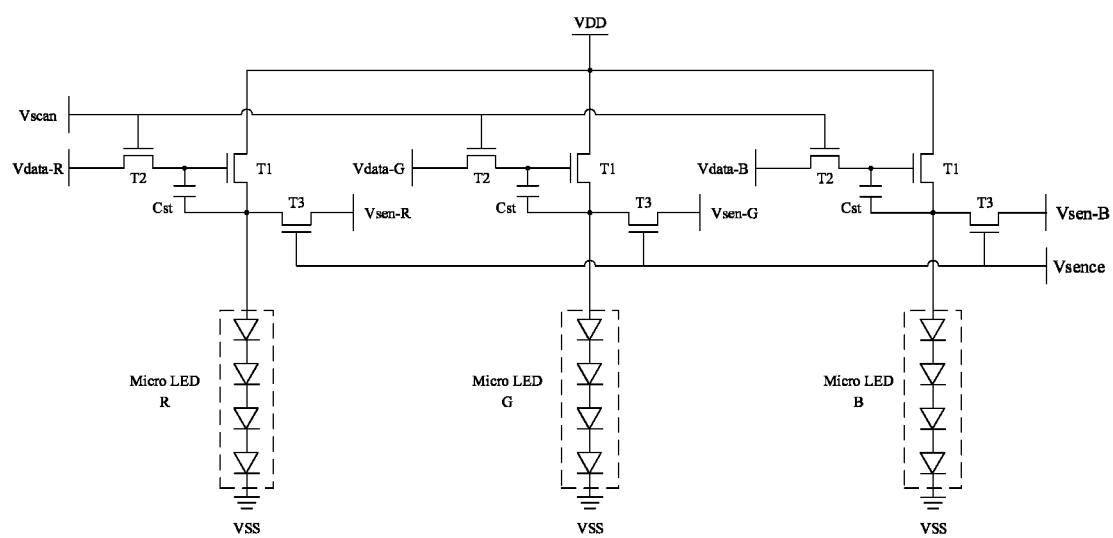
FIG. 3 is a schematic view illustrating a micro-LED pixel driving circuit according to one embodiment of the present invention.

The present invention also provides a micro-LED pixel driving circuit. The micro-LED pixel driving circuit comprises pixel-unit driving circuits arranged in an array. As shown in FIG. 3, each pixel-unit driving circuit includes red (R) and green (G), and blue (B) sub-pixel driving circuits. Taking the 3T1C circuit as an example, each sub-pixel circuit includes a driving transistor T1, a storage capacitor Cst, a first switching transistor T2, a second switching transistor T3, and a micro-LED chip. The micro-LED chip comprises several micro-LED sub-chips connected in series.

The present invention provides a micro-LED pixel driving circuit. The micro-LED pixel driving circuit includes a micro-LED chip. The micro-LED chip includes a plurality of micro-LED sub-chips connected in series with each other. Each micro-LED sub-chip obtains its own working voltage, and a voltage drop across the entire micro-LED chip is the sum of the working voltages of several micro-LED sub-chips, thereby greatly increasing a voltage across the micro-LED chip, reducing power consumption of a driving TFT, and improving a high power consumption problem of driving TFTs in conventional micro-LED displays.

According to one embodiment of the present invention, in the same pixel unit, the red sub-pixel driving circuit, the green sub-pixel driving circuit, and the blue sub-pixel driving circuit have the same number of micro-LED sub-chips. In different pixel units, the number of micro-LED sub-chips in the pixel driving circuit can be the same or different; and the specific number can vary according to actual needs of the micro-LED display panel, and the present invention is not limited in this regard.

According to the above embodiments, it can be known that: The present invention provides a micro-LED chip, a manufacturing method thereof, a micro-LED display panel, and a micro-LED pixel driving circuit. The micro-LED chip comprises a buffer layer, a first semiconductor layer, an active layer, and a second semiconductor layer, an insulating layer, a current diffusion layer, a protective layer, and a first electrode and a second electrode which are stacked on each other. The insulating layer divides the first semiconductor layer, the active layer, and the second semiconductor layer into at least two sub-chips, and the second semiconductor layer in each sub-chip is connected to the first semiconductor layer in the next sub-chip through the current diffusion layer. The first electrode is electrically connected to the first semiconductor layer of the first sub-chip, and the second electrode is electrically connected to the second semiconductor layer of the last sub-chip. The sub-chips are separated by the insulating layer, and the sub-chips are connected in series by the current diffusion layer, thereby increasing a voltage across the micro-LED chip, reducing power consumption of a driving TFT, and improving a high power consumption problem of driving TFTs of conventional micro-LED displays.

In summary, although the present invention has been disclosed above with reference to preferable embodiments, the above embodiments are not intended to limit the present invention. Those skilled in the art can make various modifications without departing from the spirit and scope of the present invention. Therefore, the protection scope of the present invention is defined by the appended claims.

What is claimed is:
1. A micro light-emitting diode (micro-LED) chip, comprising:
a buffer layer,
a first semiconductor layer, an active layer,
a second semiconductor layer,
an insulating layer,
a current diffusion layer,
a protective layer, and
a first electrode and a second electrode which are stacked on each other;
wherein the insulating layer divides the first semiconductor layer, the active layer, and the second semiconductor layer into at least two sub-chips separated from each other, said at least two sub-chips including a first sub-chip and a last sub-chip,
wherein the second semiconductor layer of each of said at least two sub-chips before said last sub-chip is connected to the first semiconductor layer of a next sub-chip of said at least two sub-chips via the current diffusion layer,
wherein the first electrode is electrically connected to the first semiconductor layer of the first sub-chip via the current diffusion layer, and
wherein the second electrode is electrically connected to the second semiconductor layer of the last sub-chip via the current diffusion layer;
wherein the current diffusion layer of each of said at least two sub-chips after the first sub-chip covers the second semiconductor layer of a previous sub-chip of said at least two sub-chips and
wherein the current diffusion layer of each of said at least two sub-chips before the last sub-chip is connected to the first semiconductor layer of a next sub-chip through a via hole defined in the insulating layer.

2. The micro-LED chip according to claim 1, wherein the current diffusion layer is in contact with a portion of the second semiconductor layer of the previous sub-chip and connected to the first semiconductor layer of the next sub-chip through a via hole defined in the insulating layer.

3. The micro-LED chip according to claim 1, wherein the first electrode is electrically and directly connected to the first semiconductor layer of the first sub-chip.

4. The micro-LED chip according to claim 1, wherein the second electrode is electrically and directly connected to the second semiconductor layer of the last sub-chip.

5. The micro-LED chip according to claim 1, wherein the first semiconductor layer is an N-type gallium nitride layer, the active layer is a gallium nitride multiple quantum well layer, the second semiconductor layer is a P-type gallium nitride layer, the first electrode is an N-type electrode, and the second electrode is a P-type electrode.

6. The micro-LED chip according to claim 1, wherein the current diffusion layer is made of tin oxide or graphene.

7. The micro-LED chip according to claim 1, wherein the buffer layer is an intrinsic gallium nitride layer.

8. A micro light-emitting diode (micro-LED) display panel, comprising
a micro-LED chip, the micro-LED chip comprising:
a buffer layer, a first semiconductor layer,
an active layer,
a second semiconductor layer,
an insulating layer,
a current diffusion layer,
a protective layer, and
a first electrode and a second electrode which are stacked on each other;
wherein the insulating layer divides the first semiconductor layer, the active layer, and the second semiconductor layer into at least two sub-chips separated from each other, said at least two sub-chips including a first sub-chip and a last sub-chip,
wherein the second semiconductor layer of each of said at least two sub-chips before said last sub-chip is connected to the first semiconductor layer of a next sub-chip of said at least two sub-chips via the current diffusion layer,
wherein the first electrode is electrically connected to the first semiconductor layer of the first sub-chip via the current diffusion layer, and
wherein the second electrode is electrically connected to the second semiconductor layer of the last sub-chip via the current diffusion layer;
wherein the current diffusion layer of each of said at least two sub-chips after the first sub-chip covers the second semiconductor layer of a previous sub-chip of said at least two sub-chips and
wherein the current diffusion layer of each of said at least two sub-chips before the last sub-chip is connected to the first semiconductor layer of a next sub-chip through a via hole defined in the insulating layer.

9. The micro-LED display panel according to claim 8, wherein the current diffusion layer is in contact with a portion of the second semiconductor of the previous sub-chip and connected to the first semiconductor layer of the next sub-chip through a via hole defined in the insulating layer.

10. The micro-LED display panel according to claim 8, wherein the first electrode is electrically and directly connected to the first semiconductor layer of the first sub-chip.

11. The micro-LED display panel according to claim 8, wherein the second electrode is electrically and directly connected to the second semiconductor layer of the last sub-chip.

12. The micro-LED display panel according to claim 8, wherein the first semiconductor layer is an N-type gallium nitride layer, the active layer is a gallium nitride multiple quantum well layer, the second semiconductor layer is a P-type gallium nitride layer, the first electrode is an N-type electrode, and the second electrode is a P-type electrode.

13. The micro-LED display panel according to claim 8, wherein the current diffusion layer is made of tin oxide or graphene.

* * * * *